United States Patent [19]

Steckler

[11] 3,895,286

[45] July 15, 1975

[54] ELECTRIC CIRCUIT FOR PROVIDING TEMPERATURE COMPENSATED CURRENT

[75] Inventor: Steven Alan Steckler, Clark, N.J.

[73] Assignee: RCA Corporation, New York, N.Y.

[22] Filed: Jan. 7, 1971

[21] Appl. No.: 104,627

[52] U.S. Cl. .................... 323/4; 307/297; 307/310; 323/9; 323/68

[51] Int. Cl. .............................................. G05f 1/58

[58] Field of Search.............. 323/4, 9, 22 T, 68, 69; 307/270, 297, 310; 330/22, 24, 30

[56] References Cited

UNITED STATES PATENTS

| | | | |
|---|---|---|---|
| 3,531,730 | 9/1970 | Steckler | 330/24 |
| 3,560,995 | 2/1971 | Zielinski et al. | 323/68 X |
| 3,573,504 | 4/1971 | Breuer | 323/4 X |
| 3,588,672 | 6/1971 | Wilson | 323/4 |

*Primary Examiner*—Gerald Goldberg
*Attorney, Agent, or Firm*—Eugene M. Whitacre; Kenneth R. Schaefer

[57] ABSTRACT

An electrical circuit including a resistor, a voltage source and a temperature independent voltage divider arrangement, the voltage divider including semiconductor amplifying devices for coupling the source across the resistor and being arranged such that the temperature variation of the resistor value and that of the divided voltage impressed across the resistor are substantially equal to provide a temperature compensated, substantially constant current through the resistor. The desired output current is provided from a relatively high source impedance by means of one of the semiconductor devices of the divider or by means of an additional semiconductor device.

10 Claims, 1 Drawing Figure

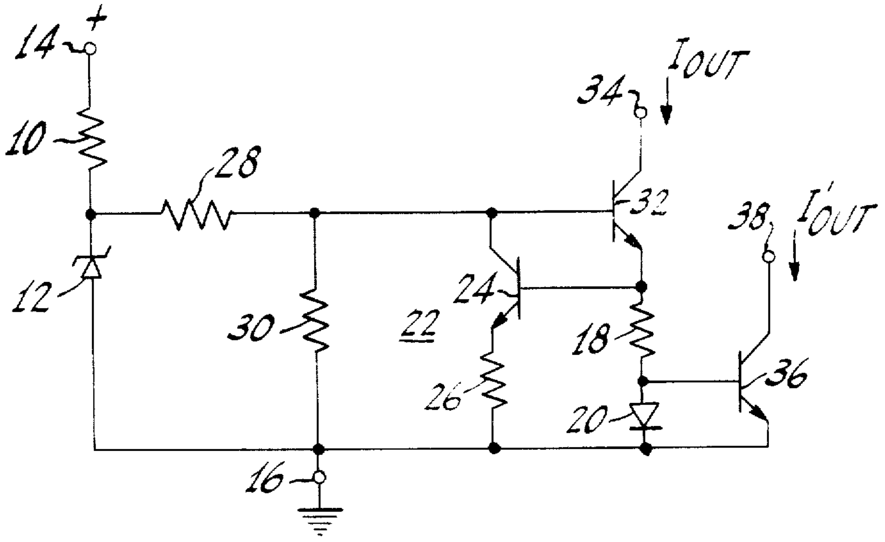
Inventor:
STEVEN A. STECKLER
BY Kenneth R. Schaefer
Attorney

ELECTRIC CIRCUIT FOR PROVIDING TEMPERATURE COMPENSATED CURRENT

This invention relates to electrical circuits which may be employed, for example, in connection with amplifiers or other electrical apparatus, to provide currents substantially independent of supply voltage variations and/or temperature variations. Such circuits are particularly suited for fabrication in monolithic integrated form wherein close thermal coupling, matching of characteristics of active devices such as transistors and close matching of resistance ratios are relatively easily attained. The invention will therefore be described in that environment.

The various components, such as transistors, diodes and resistors, fabricated in an integrated circuit exhibit predictable temperature dependencies. For example, the value of diffused resistors increases at a predetermined rate with increasing temperature. On the other hand, at a given current level, the forward voltage drop across a semiconductor junction, such as the base-emitter of a transistor or diode-connected transistor (i.e., $V_{be}$), decreases at a second predetermined rate as temperature increases. Avalanche diode (e.g., Zener diodes) can be fabricated so as to exhibit a positive, a negative or a substantially zero temperature coefficient depending upon, among other parameters, the reverse breakdown voltage and current at which they are operated. Since the components on a monolithic integrated circuit are in close physical proximity and good thermal conductivity exists between such components, the total variation in operating characteristics as a function of temperature of an assemblage of such components (i.e., a circuit) is predictable. Components exhibiting negative temperature coefficients may therefore be combined with components exhibiting positive temperature coefficients with currents source net effect of producing an operating parameter such as current which is substantially independent of temperature. One such approach to providing temperature compensated current sources is described in U.S. Pat. No. 3,534,245, granted Oct. 13, 1970 in the name of Allen LeRoy Limberg and assigned to the same assignee as the present invention. In the Limberg patent, circuit arrangements are described wherein a predetermined number of forward biased semiconductor junction voltage drops (e.g., $V_{be}$ s) are coupled in series with a temperature dependent resistor across a source of voltage. The number of voltage drops is selected so as to provide the desired temperature compensated current through the resistor. The Limberg circuit arrangements are rendered independent of supply voltage variations by, for example, inclusion in the voltage source of an avalanche diode.

In accordance with the present invention, a temperature compensated currentsource is provided by means of a resistor having a first temperature coefficient which is coupled across a source of voltage having a second temperature coefficient. The source of voltage comprises a temperature independent voltage divider having at least first and second semiconductor devices coupled together in a feedback arrangement so as to produce across the resistor a voltage equal to the ratio of the temperature coefficient of the resistor to the temperature coefficient of the source. Stabilization against supply voltage variation is provided by including a voltage regulating arrangement such as an avalanche diode within the voltage source.

The novel features that are considered characteristic of this invention are set forth in the appended claims. The invention itself, however, both as to its organization and method of operation, as well as additional objects, will best be understood from the following description when read in connection with the accompanying drawing which illustrates, in schematic circuit diagram form, a current source constructed in accordance with the present invention.

Referring to the drawing, the current source preferably is fabricated in integrated circuit form. The current source comprises the series combination of a current limiting resistor 10 and an avalanche diode 12 coupled across a source of operating voltage (+) by means of terminals 14 and 16, the latter terminal being connected to a reference point such as ground. The avalanche or Zener voltage produced across diode 12 is divided, for application across the series combination of a resistor 18 and a diode 20, by means of an active device divider arrangement indicated generally by the reference numeral 22. Active divider arrangement 22 includes a first transistor 24 arranged in a degenerated common emitter configuration. A resistor 26 is connected between the emitter of transistor 24 and ground terminal 16. A resistive voltage divider comprising resistors 28 and 30 is connected across diode 12. The junction of resistors 28 and 30 is connected to the collector electrode of transistor 24. A second transistor 32, arranged in negative feedback relation with transistor 24, includes a base electrode coupled to the collector of transistor 24, an emitter electrode coupled in common to the base of transistor 24 and to the end of resistor 18 remote from diode 18. Transistor 32 also includes a collector electrode connected to a first output terminal 34. Active device voltage dividers of the illustrated type are shown and described in U.S. Patent No. 3,383,612 granted to L. A. Harwood and assigned to the same assignee as the present invention.

A third transistor 36 may also be provided to produce output current at a second output terminal 38. Transistor 36 comprises base and emitter electrodes coupled across diode 20 and a collector-electrode connected to terminal 38. Transistor 36 and diode 20 are arranged to exhibit proportionally related conduction characteristics as is described in my U.S. Pat. No. 3,531,730 which is assigned to the same assignee as the present invention.

The illustrated circuit operates in the following manner. It will be assumed for purpose of explanation that the current gain ($\beta$) of each of transistors 24, 32 and 36 is sufficiently great that collector and emitter current of a given device are substantially equal and that, in comparison, base current is negligible. Such an assumption is justified in the case of the illustrated NPN transistors fabricated in integrated circuit form.

In that case, the output current ($I_{out}$) provided at terminal 34 may be considered equal to the current flowing in the series combination of resistor 18 and diode 20. The output current at a given temperature $T_1$ may be expressed as $$I_{0_1} = \frac{E - V_{D20}}{R_{18}}, \text{ where}$$

$E$ = voltage at base of transistor 24 with respect to terminal 16 (volts);

$V_{D20}$ = voltage across diode 20 (volts);

$R_{18}$ = resistance of resistor 18 (ohms). The output current at a second temperature $T_2$ may be expressed as:

$$I_{o_2} = \frac{E + \Delta E - [V_{D20} + \Delta V_{D20}]}{R_{18} + \Delta R_{18}}, \text{ where}$$

$\Delta E$ = change in voltage at base of transistor 24 for change in temperature from $T_1$ to $T_2$;

$\Delta V_{D20}$ = change in voltage across diode 20 for change in temperature from $T_1$ to $T_2$;

$\Delta R_{18}$ = change in resistance of resistor 18 for change in temperature from $T_1$ to $T_2$.

The necessary conditions for stabilizing the output current as a function of temperature can be determined by setting the expressions for $I_{o_1}$ and $I_{o_2}$ equal as follows:

$$\frac{E - V_{D20}}{R_{18}} = \frac{E + \Delta E - [V_{D20} + \Delta V_{D20}]}{R_{18} + \Delta R_{18}}$$

This expression may be solved for the voltage E required for constant current to yield:

$$E_{const\ I} = \frac{R_{18}(\Delta E - \Delta V_{D20})}{\Delta R_{18}} + V_{D20}$$

Assuming, for purposes of simplification, that the voltage E is independent of temperature and therefore, that $\Delta E$ is zero, the above expression may be rearranged as $$\frac{-\Delta V_{D20}}{E_{const\ I} - V_{D20}} = \frac{\Delta R_{18}}{R_{18}}$$

Thus, the current $I_{out}$ may be rendered independent of temperature by selecting the voltage across resistor 18 (that is, E - $V_{D20}$) such that the temperature dependence of such voltage and the temperature dependence of the resistance value of resistor 18 are equal and opposite. Where the circuit is constructed utilizing monolithic silicon processes, the voltage drop of the forward biased semiconductor junction (i.e., $V_{be}$) associated with diode 20 equals approximately 0.7 volts for a wide range of currents, while the change in forward voltage drop as a function of temperature equals approximately −1.75 millivolts per degree centigrade of temperature change. Resistance values in such a structure change approximately +1.9 parts per thousand ohms per degree centigrade of temperature for a typical diffused resistor of 200 ohms per square. Substituting the above values for $\Delta V_{D20}$ and $\Delta R_{18}/R_{18}$ in the expression for $E_{const\ I}$ yields:

$$E_{const\ I} = \frac{1.75}{1.9} + 0.7 = 1.62 \text{ volts.}$$

The required temperature-independent level of 1.62 volts may be derived from a standard avalanche diode having substantially zero temperature coefficient by means of the temperature independent active voltage divider 22. Typically, zero temperature coefficient avalanche diodes constructed in integrated form exhibit a reverse breakdown voltage substantially greater than the required 1.62 volts (e.g., of the order of 6.2 volts). The voltage across diode 12 may, however, readily be divided by a predetermined factor substantially independent of temperature by means of divider 22.

Assuming resistor 10 is relatively large compared to resistors 28 and 30, the combination of diode 12 and resistors 28 and 30 may be replaced by an equivalent voltage source having a voltage of $$(V_{12})\frac{R_{30}}{R_{28} + R_{30}}$$

and a source impedance equal to the parallel combination of resistors 28 and 30

$$\text{i.e., } \frac{R_{28} R_{30}}{R_{28} + R_{30}}.$$

In accordance with the teachings of the earlier-referenced Harwood Pat. No. 3,383,612, by making the resistor 26 equal to the parallel combination of resistors 28 and 30, the voltage at the base electrode of transistor 24 will be equal to one-half that of the applied equivalent voltage source substantially independent of temperature. In the illustrated circuit, the equivalent source $$(V_{12})\frac{R_{30}}{R_{28} + R_{30}}$$

is therefore selected equal to 3.24 volts to obtain the desired temperature independent output current ($I_{out}$). The resistors 28 and 30 permit the use of a diode 12 having a breakdown voltage other than the required 3.24 volts.

It should be noted that, in integrated circuits, the ratio of resistor values may readily be controlled to close tolerances and also that such ratios are, for all practical purposes, independent of operating temperature. It should also be noted that the use of diode 12 renders the voltage supplied across resistor 18 substantially insensitive to variations in the main supply voltage provided across terminals 14 and 16.

The particular output current supplied at the collector of transistor 32 is determined by the value of resistor 18. Multiples of that current may be provided, if desired, by means of transistor 36 and/or additional similar transistors having their input circuits (base-emitter electrodes) coupled across diode 20.

The illustrated circuit is capable of providing a predetermined current substantially insensitive to supply voltage and temperature variations. The stabilized current is provided from a relatively high source impedance in the case of either the collector of transistor 32, or the collector of transistor 36.

It should also be noted that various modifications may be made in the illustrated circuit. For example, avalanche diode 12 may be replaced by a different type of regulating device. If the substituted regulating device exhibits a temperature dependent voltage characteristic, such characteristic may also be taken into consideration in the above computations. Furthermore, the active device divider 22 may be arranged to provide a factor other than one-half as is set forth in the Harwood Patent No. 3,383,612. Additional diodes or other devices may be included in the circuit. Any such additions or deletions must, however, be reflected in the computation of the voltage E to be provided at the base of transistor 24.

What is claimed is:

1. An electrical circuit comprising:
a first resistance exhibiting a predetermined relative change in resistance value as a function of temperature,
a source of operating voltage having supply and reference terminals,
coupling means exhibiting, between first and second terminals adapted for connection to said first resistance, a predetermined relative change of voltage as a function of temperature selected with respect to said resistance change, for producing a temperature compensated current through said first resistance, said coupling means comprising:
a voltage divider including at least first and second transistors, each having base, emitter and collector electrodes,
a second resistance direct current coupled between said supply terminal and said collector of said first transistor,
a third resistance proportionally related to said second resistance direct current coupled between said reference terminal and said emitter of said first transistor,
means for direct current coupling said base and emitter electrodes of said second transistor, respectively, to said collector and base electrodes of said first transistor, and
means comprising at least one semiconductor junction exhibiting a negative temperature coefficient of voltage for direct current coupling said first resistance between said emitter of said second transistor and said reference terminal.

2. An electrical circuit according to claim 1 wherein: said coupling means comprises voltage stabilizing means coupled between said supply and reference terminals for supplying to said voltage divider a voltage substantially unaffected by amplitude variations of said operating voltage.

3. An electrical circuit according to claim 2 wherein: said second and third resistances are selected to provide a voltage between said first and second terminals such that said relative changes in resistance and voltage are substantially equal.

4. An electrical circuit according to claim 2 wherein: said first resistance exhibits a positive temperature coefficient of resistance.

5. An electrical circuit according to claim 2 wherein: said first resistance exhibits a positive temperature coefficient of resistance, said second and third resistances being selected to provide a voltage between said first and second terminals related to the ratio of said temperature coefficient of voltage and said temperature coefficient of resistance.

6. An electrical circuit according to claim 4 wherein: said semiconductor junction is poled in the same direction as the base-emitter junction of said second transistor and is direct coupled between said second and reference terminals, said emitter of said second transistor being direct coupled to said first terminal.

7. An electrical circuit according to claim 6 wherein: said voltage stabilizing means comprises an avalanche diode direct coupled between said supply and reference terminals.

8. An electrical circuit according to claim 7 wherein: said second transistor is arranged for providing said temperature compensated current at its collector electrode.

9. An electrical circuit according to claim 7 wherein: said means for direct current coupling said first resistance between said second transistor emitter and said reference terminal further comprises a third transistor having base and emitter electrodes directly connected across said semiconductor junction and a collector electrode at which said current is provided.

10. An electrical circuit comprising:
a source of operating voltage having supply and reference terminals,
an avalanche diode direct current coupled across said terminals,
a first resistance exhibiting a positive temperature coefficient of resistance,
a semiconductor diode exhibiting a negative temperature coefficient of voltage direct current coupling one end of said resistance to said reference terminal,
a voltage divider coupled between the other end of said resistance and said avalanche diode comprising:
at least first and second transistors, each having base, emitter and collector electrodes,
a second resistance direct current coupled between said avalanche diode and said collector of said first transistor,
a third resistance proportionally related to said second resistance direct current coupled between said reference terminal and said emitter of said first transistor, and
means for direct current coupling said base and emitter electrodes of said second transistor, respectively, to said collector and base electrodes of said first transistor and for direct current coupling said emitter of said second transistor to said first resistance.

* * * * *